(12) United States Patent
Kord et al.

(10) Patent No.: US 12,323,179 B2
(45) Date of Patent: Jun. 3, 2025

(54) CONFIGURABLE RADIO TRANSCEIVER AND METHOD THEREOF

(71) Applicant: Realtek Semiconductor Corp., Hsinchu (TW)

(72) Inventors: Ahmed Kord, San Diego, CA (US); Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 378 days.

(21) Appl. No.: 18/172,377

(22) Filed: Feb. 22, 2023

(65) Prior Publication Data
US 2024/0283480 A1   Aug. 22, 2024

(51) Int. Cl.
| | | |
|---|---|---|
| H04B 1/40 | (2015.01) | |
| H02H 9/04 | (2006.01) | |
| H03F 3/19 | (2006.01) | |
| H05K 1/02 | (2006.01) | |

(52) U.S. Cl.
CPC ............... *H04B 1/40* (2013.01); *H02H 9/045* (2013.01); *H03F 3/19* (2013.01); *H05K 1/0243* (2013.01); *H03F 2200/294* (2013.01); *H03F 2200/451* (2013.01)

(58) Field of Classification Search
CPC .......... H04B 1/18; H04B 5/72; H04B 1/0458; H04B 5/20; H04B 5/24; H04B 5/45; H04B 5/77; H04B 5/79; H04B 1/40; H04B 1/1615; H04B 1/38; H04B 1/48; H04B 1/52; H04B 5/75; H04B 7/2643
USPC ........................................................... 455/73
See application file for complete search history.

(56) References Cited

U.S. PATENT DOCUMENTS

| | | | |
|---|---|---|---|
| 11,094,652 B1 | 8/2021 | Leong | |
| 2002/0034934 A1* | 3/2002 | Watanabe | H01P 1/15 455/318 |
| 2002/0167060 A1* | 11/2002 | Buijsman | H01L 23/552 257/E23.114 |
| 2007/0279099 A1* | 12/2007 | Goddard | H04B 1/1615 326/83 |

* cited by examiner

*Primary Examiner* — Ajibola A Akinyemi
(74) *Attorney, Agent, or Firm* — McClure, Qualey & Rodack, LLP

(57) ABSTRACT

A radio frequency integrated circuit (RFIC) includes a transmitter, a receiver, a first pin electrically shorted to a first node wherein the transmitter and the receiver are connected, and a second pin electrically shorted to a second node within the receiver. The RFIC is soldered on a printed circuit board (PCB). In a transmitter-receiver co-share configuration, the first pin is terminated with a high-impedance component on the PCB. In a transmitter-receiver split configuration, the first pin and the second pin are coupled through an external capacitor on the PCB.

20 Claims, 5 Drawing Sheets

CONFIGURABLE RADIO TRANSCEIVER AND METHOD THEREOF

BACKGROUND OF THE DISCLOSURE

Field of the Disclosure

The present disclosure generally relates to radio transceiver utilizing a magnetic coupling to improve a layout efficiency of impedance-matching inductors.

Description of Related Art

As depicted in FIG. 1A, a radio transmitter 100A comprises a power amplifier (PA) that amplifies a first RF (radio frequency) signal $X_1$ into a second RF signal $X_2$, and a transmitting antenna 111 that radiates the second RF signal $X_2$ unto the air. As depicted in FIG. 1B, a radio receiver 100B comprises a receiving antenna 121 that picks up a third RF signal $X_3$ from the air, and a low-noise amplifier (LNA) 141 that amplifies the third RF signal $X_3$ into a fourth RF signal $X_4$. A radio transceiver embodies both a radio transmitter and a radio receiver, and there can be a two-antenna embodiment and a one-antenna embodiment. In a two-antenna embodiment, a radio transceiver comprises a combination of radio transmitter 100A of FIG. 1A and a radio receiver 100B of FIG. 1B. This way, there are two antennas, one for transmitting and the other for receiving. This two-antenna embodiment is more expensive, but may lead to a better performance, because radio transmitter 100A and ratio receiver 100B are separate and can be optimized independently. In a one-antenna embodiment as depicted in FIG. 1C, a radio transceiver 100C comprises a power amplifier (PA) 151, a low-noise amplifier (LNA) 161, a co-share network 171, and an antenna 181. PA 151 receives a fifth signal $X_5$ and amplifies into a sixth signal $X_6$. LNA 161 receives a seventh signal $X_7$ and amplifies into an eighth signal $X_8$. The co-share network 171 functions as both an interface between the antenna 181 and the PA 151 and an interface between the antenna 181 and the LNA 161. This one-antenna embodiment is more cost effective, but more difficult to design since the transmitter and the receiver are not separate and cannot be optimized independently. Radio transceiver 100C may operate in two duplexing schemes: the first scheme is frequency domain duplexing (FDD), wherein a transmitter function and a receiver function are activated at the same time, PA 151 and the LNA 161 are simultaneously turned on, but the fifth RF signal $X_5$ and the eighth RF signal $X_8$ are of a different frequency; the second scheme is time domain duplexing (TDD), wherein a transmitter function and a receiver function are not activated at the same time, PA 151 and the LNA 161 are turned on alternately, and the fifth RF signal $X_5$ and the eighth RF signal $X_8$ are of the same frequency.

This present disclosure is directed to the TDD scheme. During a time when the transmitter function is activated, the PA 151 is turned on, the LNA 161 is turned off, the co-share network 171 relays the sixth RF signal $X_6$ into a ninth RF signal $X_9$ that is radiated to the air by the antenna 181. During a time when the receiver function is activated, the PA 151 is turned off, the LNA 161 is turned on, and the ninth RF signal $X_9$ is picked up by the antenna 181, and the co-share network 171 relays the ninth RF signal $X_9$ into the seventh RF signal $X_7$. To efficiently relay the sixth RF signal $X_6$ into the ninth RF signal $X_9$ when the transmitter function is activated, the co-share network 171 must effectively mitigate a loading effect from the LNA 161. Likewise, to efficiently relay the ninth RF signal $X_9$ into the seventh RF signal $X_7$ when the receiver function is activated, the co-share network 171 must effectively mitigate a loading effect from the PA 151.

Modern radio transceivers rely on a high level of integration and utilize packaged radio frequency integrated circuits (RFIC) to reduce costs and form factors, wherein integrated circuits that embody a radio transceiver function are packaged as an electronic component that can be soldered on a printed circuit board (PCB). The two-antenna embodiment and the one-antenna embodiment of radio transceiver obviously need to use different printed circuit boards. However, it is highly desirable if the same packaged integrated circuits can be used in either embodiment.

In U.S. Pat. No. 11,094,652, Leong and Lin disclosed a configurable radio transceiver that utilizes a combination of a cross-bonding and three impedance matching inductors to allow both a two-antenna embodiment and a one-antenna embodiment. Despite the advancement of this previous invention, further improvements are desired.

BRIEF DESCRIPTION OF THIS DISCLOSURE

In an embodiment, a radio frequency integrated circuits (RFIC) comprise a transmitter, a receiver, a first pin electrically shorted to a first node, and a second pin electrically shorted to a second node, wherein: the transmitter comprises a power amplifier configured to amplify a to-be-transmitted signal into a first amplified signal in accordance with a second logical signal, a first balun transformer configured to transform the first amplified signal into a first voltage at the first node, and a first switch-capacitor network comprising a serial connection of a first capacitor and a first switch controlled by a first logical signal and configured to shunt the first node to a first ground via the first capacitor when the first logical signal is asserted; the receiver comprises a T-coil comprising a first inductor inserted between the first node and the second node and a second inductor inserted between the second node and a third node, a second switch-capacitor network comprising a serial connection of a second capacitor and a second switch controlled by a second logical signal and configured to shunt the third node to a second ground via the second capacitor when the second logical signal is asserted, a third switch controlled by a third logical signal and configured to shunt the third node to the second ground when the third logical signal is asserted, a low-noise amplifier configured to amplify a third voltage at the third node into a second amplified signal in accordance with a fourth logical signal, and a second balun transformer configured to transform the second amplified signal into a received signal.

In an embodiment, a method of integrating a RFIC comprises: incorporating a transmitter comprising a power amplifier configured to amplify a to-be-transmitted signal into a first amplified signal in accordance with a second logical signal, a first balun transformer configured to transform the first amplified signal into a first voltage at a first node, and a first switch-capacitor network comprising a serial connection of a first capacitor and a first switch controlled by a first logical and configured to shunt the first node to a first ground via the first capacitor when the first logical signal is asserted; incorporating a receiver comprising a T-coil comprising a first inductor inserted between the first node and the second node and a second inductor inserted between the second node and a third node, a second switch-capacitor network comprising a serial connection of a second capacitor and a second switch controlled by a second logical signal and configured to shunt the third node to a second ground via the second capacitor when the second logical signal is asserted, a third switch controlled by a third logical signal and configured to shunt the third node to the second ground when the third logical signal is asserted, a low-noise amplifier configured to amplify a third voltage at the third node into a second amplified signal in accordance with a fourth logical signal, a second balun transformer configured to transform the second amplified signal into a received signal; and integrating the transmitter and the receiver onto a RFIC with a first pin electrically shorted to the first node and a second pin electrically shorted to the second.

DETAILED DESCRIPTION OF THIS DISCLOSURE

Figure 1A:
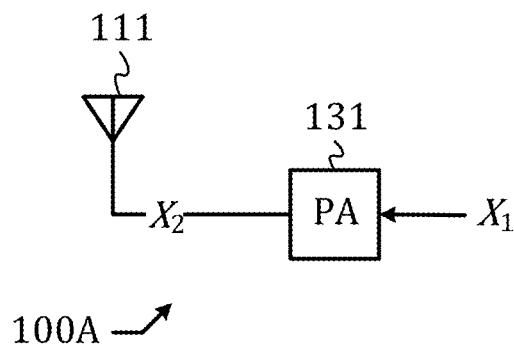
FIG. 1A shows a functional block diagram of a radio transmitter.
Figure 1B:
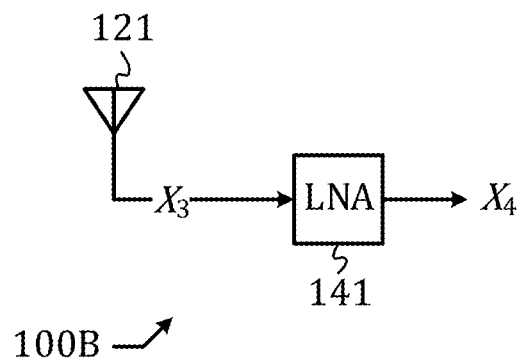
FIG. 1B shows a functional block diagram of a radio receiver.
Figure 1C:
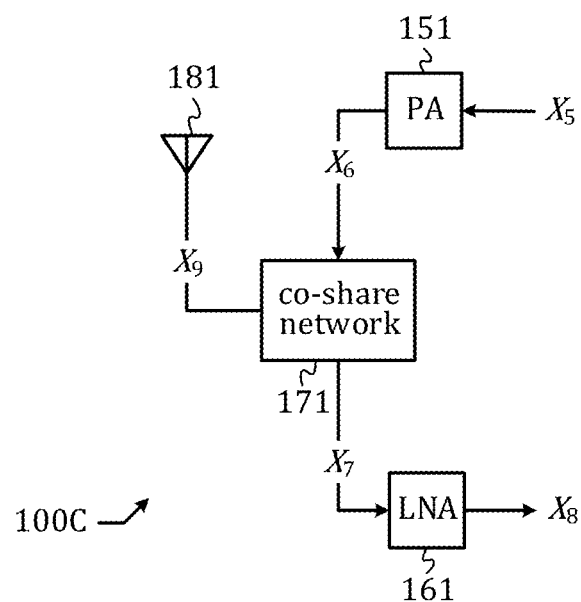
FIG. 1C shows a functional block diagram of a radio transceiver.

The present disclosure is directed to radio transceiver. This present disclosure is directed to an improvement over the invention of U.S. Pat. No. 11,094,652, by not relying a cross-bond, eliminating one inductor, and utilizing a magnetic coupling to improve a layout efficiency of the two remaining impedance-matching inductors. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "signal," "power supply," "ground," "CMOS (complementary metal oxide semiconductor)," "NMOS (n-channel metal oxide semiconductor)," "PMOS (p-channel metal oxide semiconductor)," "inductor," "T-coil," "capacitor," "balun transformer," "inverter," "amplifier," "cascode," "common-source amplifier," "differential," "single-ended" "logical signal," and "switch." Terms like these are used in a context of microelectronics, and the associated concepts are apparent to those of ordinary skills in the art and thus will not be explained in detail here.

Those of ordinary skill in the art can recognize a capacitor symbol, an inductor symbol, a balun transformer symbol, and can recognize a MOS (metal-oxide semiconductor) transistor symbol, for both PMOS transistor and NMOS transistor, and identify the "source," the "gate," and the "drain" terminals thereof. Those of ordinary skills in the art can read schematics of a circuit comprising components such as capacitors, inductors, NMOS transistors, PMOS transistors, and so on, and do not need a verbose description about how one component connects with another in the schematics.

This present disclosure is disclosed in terms of an engineering sense. For instance, regarding two variables X and Y, when it is said that "X is equal to Y," it means that "X is approximately equal to Y," i.e., "a difference between X and Y is smaller than a specified engineering tolerance." When it is said that "X is zero," it means that "X is approximately zero," i.e. "X is smaller than a specified engineering tolerance." When it is said that "X is substantially smaller than Y," it means that "X is negligible with respect to Y," i.e. "a ratio between X and Y is smaller than an engineering tolerance and therefore X is negligible when compared to Y."

An active circuit comprises a NMOS transistor, a PMOS transistor, or both properly biased and configured as a gain device. An active circuit must receive a current from a power supply node and return the current via a ground node; the active device is said to work in a power domain across the power supply node and the ground node. A ground node is a circuit node of a voltage that is approximately zero but might have a small high-frequency fluctuation. In this present disclosure, "ground node" may be simply referred to as "ground" without causing confusion, because its meaning is clear from the context. A power supply node is a circuit node of a voltage that is approximately equal to a power supply voltage that is higher than zero, but might have a small high-frequency fluctuation.

Throughout this disclosure, "$V_{DD1}$" denotes a first power supply node, "$V_{DD2}$" denotes a second power supply node, "$V_{SS1}$" denotes a first ground node, "$V_{SS2}$" denotes a second ground node. In this disclosure, depending on a context that is apparent to those of ordinary skill in the art, sometimes $V_{DD1}$ refers to the voltage level at the first power supply node $V_{DD1}$. For instance, it is apparent that "$V_{DD1}$ is 3.3V" means that the voltage level at the first power supply node $V_{DD1}$ is 3.3V.

In this present disclosure, a signal is a voltage of a variable level that carry a certain information and can vary with time. A level of the signal at a moment represents a state of the signal at that moment. The term "voltage" and the term "signal" are interchangeable in this present disclosure provided a level of said voltage is variable, carries a certain information, and can vary with time.

A logical signal is a voltage signal of two states: a low state and a high state. The low state is also referred to as a "0" state, while the high stage is also referred to as a "1" state. Regarding a logical signal Q, "Q is high" or "Q is low," means that "Q is in the high state" or "Q is in the low state." Likewise, "Q is 1" or "Q is 0," means that "Q is in the 1 state" or "Q is in the 0 state."

A first logical signal is said to be a logical inversion of a second logical signal, if the first logical signal and the second logical signal are always in opposite states. That is, when the first logical signal is low, the second logical signal is high; when the first logical signal is high, the second logical signal is low. When a first logical signal is said to be a logical inversion of a second logical signal, the first logical signal and the second logical signal are said to be complementary to each other.

In this present disclosure, a logical signal is used to enable a function; the logical signal is said to be "asserted" when it is in the state that enables the function; otherwise, the logical signal is said to be "de-asserted."

A switch is a device of two possible states, "on" and "off." A switch is approximately a short circuit when it is in the "on" state and approximately an open circuit when it is in the "off" state. A switch can be embodied using either a NMOS transistor or a PMOS transistor. When a MOS transistor, either a NMOS transistor or a PMOS transistor, is used to embody a switch, it is controlled by a control signal that is a logical signal applied at a gate of the MOS transistor. A switch embodied by a NMOS transistor is in an "on" state when the control signal is high, and in an "off" state when the control signal is low. A switch embodied by a PMOS transistor is in an "on" state when the control signal is low, and in an "off" state when the control signal is high. In any case, a switch is in an "on" ("off") state when its control signal is asserted (de-asserted).

A circuit is a collection of a transistor, a resistor, and/or other electronic devices inter-connected in a certain manner to embody a certain function. A network is a circuit or a collection of circuits incorporated to fulfill a certain function.

An objective of the present invention is to have a RFIC (radio frequency integrated circuits) that can be used in various configurations of radio transceiver. The RFIC has a plurality of pins, via which the RFIC is soldered on a printed circuit board (hereafter, PCB), said plurality of pins including a first pin labeled by "p1" and a second pin labeled by "p2." In a first configuration 210 shown in FIG. 2A, a RFIC 212 is soldered on a PCB 211, with the first pin "p1" being connected to antenna 214 via a transmission line 213, and the second pin "p2" being terminated with a high-impedance ($Z_H$) device 215 laid out on PCB 211. By way of example but not limitation, in an embodiment, the high-impedance device 215 is a 1 M-Ohm resistor. This is a one-antenna radio transceiver configuration wherein antenna 214 functions as both a transmitting antenna and a receiving antenna. In a second configuration as shown in FIG. 2B, a RFIC 222 is soldered on PCB 221, with a first pin "p1" being connected to antenna 226 via transmission line 225, a second pin "p2" being connected to antenna 224 via transmission line 223, and the second pin "p2" being coupled to the first pin "p1" via an on-board capacitor 227. This is a two-antenna radio transceiver configuration, wherein antenna 226 is a transmitting antenna and antenna 224 is a receiving antenna. In a third configuration, a frontend module (FEM) 233 is included, wherein the FEM 233 has a plurality of pins including a bi-directional pin labeled as "A," an input pin labeled as "T," and an output pin labeled as "R." As shown in FIG. 2C, a RFIC 232 is soldered on PCB 231, with a first pin "p1" being connected to the input pin "T" of FEM 233 via transmission line 235, a second pin "p2" being connected to the output pin "R" of the FEM 233 via transmission line 236, and the second pin "p2" being coupled to the first pin "p1" via an on-board capacitor 237, the bi-directional pin "A" of the FEM 233 being connected to antenna 234 via transmission line 238. This is a one-antenna radio transceiver configuration with potentially better performance than the first configuration 210 of FIG. 2A, if FEM 233 comprise circuits that offer a better performance than frontend circuits in RFIC 232. In practice, additional components can be inserted in any of the three configurations 210, 220, and 230 at a discretion of a radio transceiver designer. For instance, a filter circuit, which comprises an inductor, a capacitor, or a filter module, can be inserted in any of the transmission lines. The first configuration is said to be a TX-RX co-share configuration (hereafter "co-share" for short), while both the second figuration and the third configuration are said to be a TX-RX split (hereafter "split" for short) configuration.

Note that RFIC 212, 222, and 232 are the same RFIC but instantiated and used in different configurations.

Figure 2A:
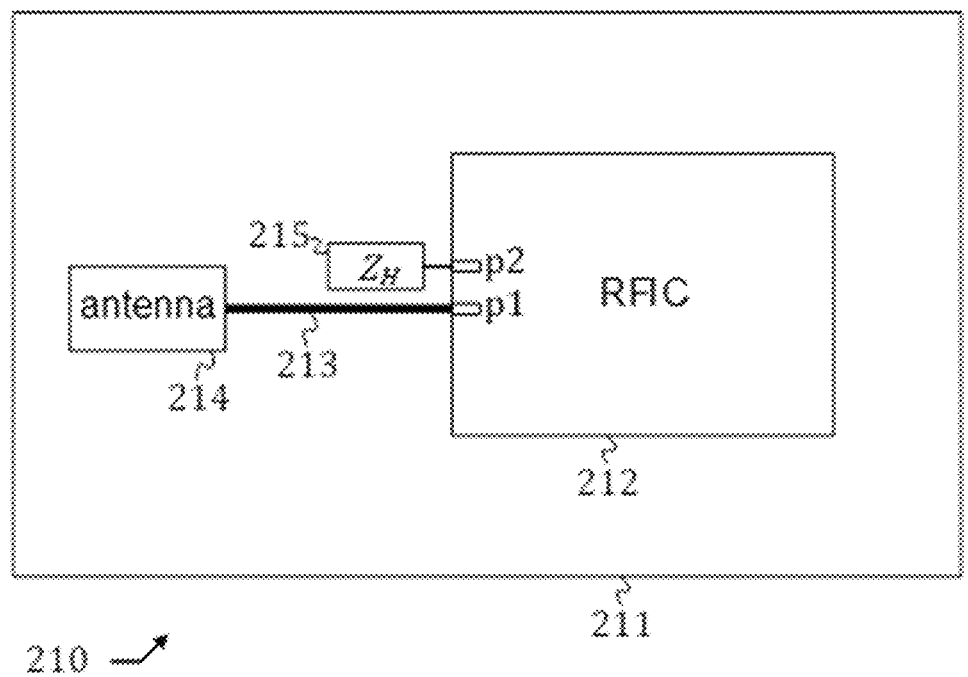
FIG. 2A shows a first configuration of radio transceiver in accordance with an embodiment of the present disclosure.
Figure 2B:
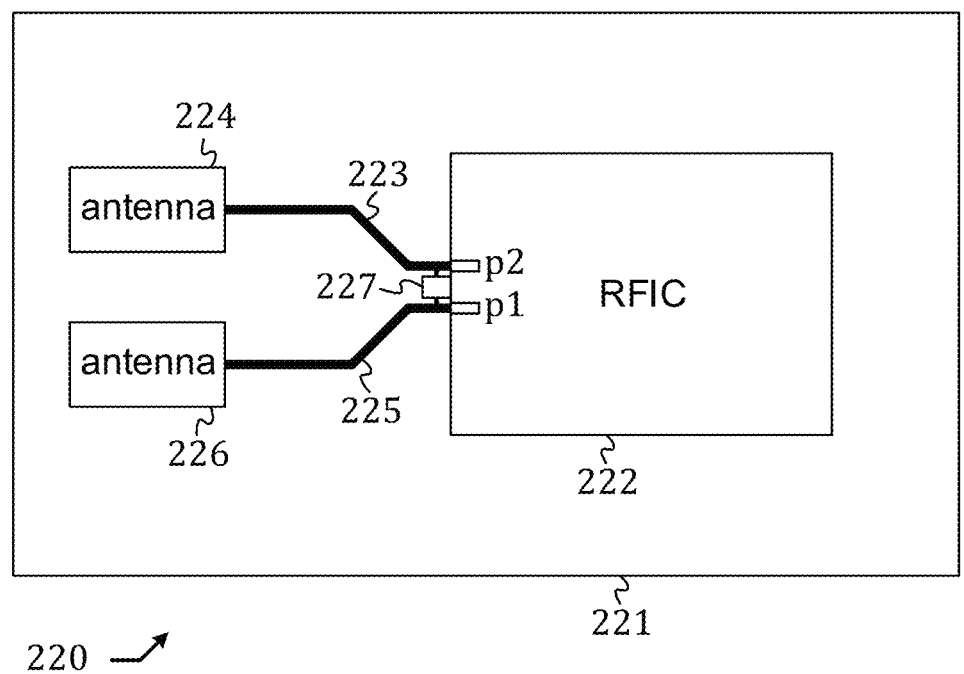
FIG. 2B shows a second configuration of radio transceiver in accordance with an embodiment of the present disclosure.
Figure 2C:
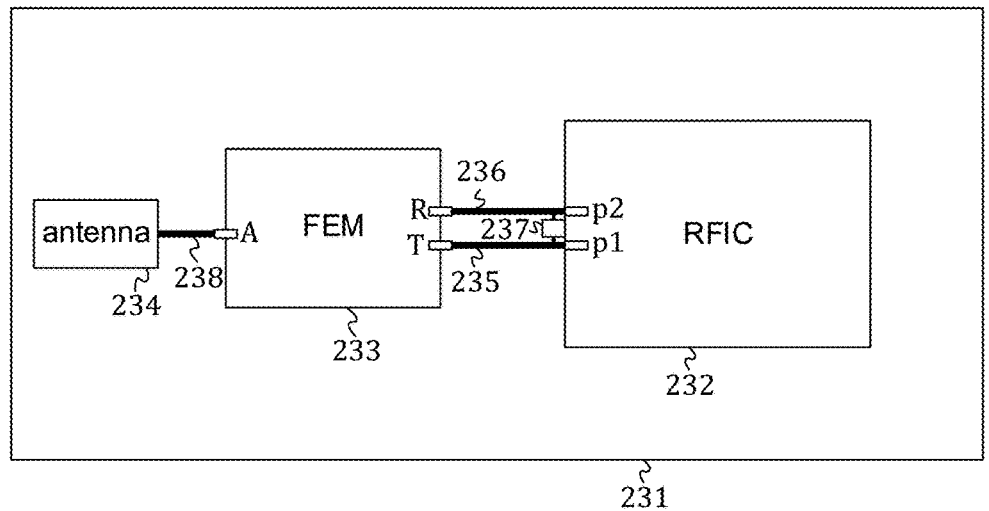
FIG. 2C shows a third configuration of radio transceiver in accordance with an embodiment of the present disclosure.
Figure 3:
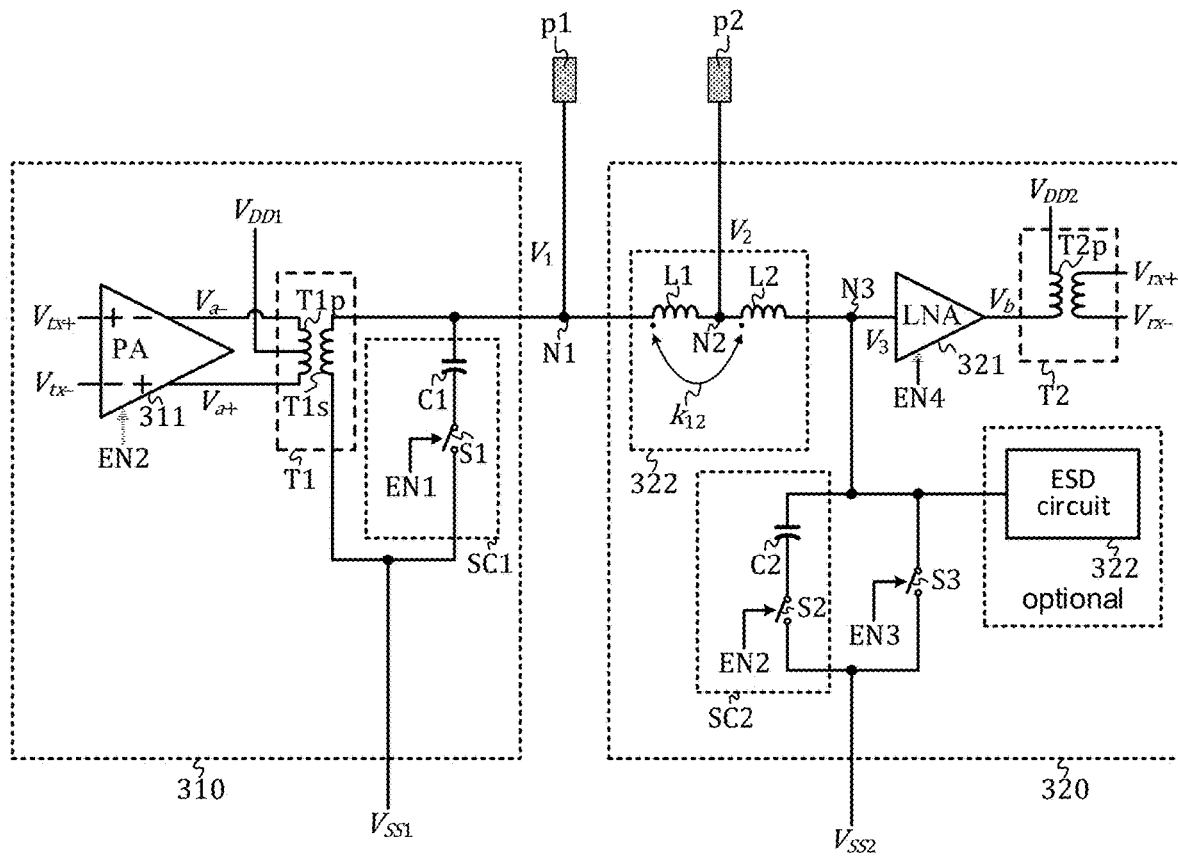
FIG. 3 shows a schematic diagram of a RFIC in accordance with the present disclosure.

A RFIC 300 in accordance with an embodiment of the present disclosure is depicted in FIG. 3. RFIC 300 can be instantiated to embody the RFIC 212 in FIG. 2A, the RFIC 222 in FIG. 2B, and the RFIC 232 in FIG. 2C. In RFIC 300, a first node N1 is electrically shorted to the first pin "p1," while a second node N2 is electrically shorted to the second pin "p2." RFIC 300 comprises a transmitter 310 and a receiver 320. RFIC 300 are controlled by a first logical signal EN1, a second logical signal EN2, a third logical signal EN3, and a fourth logical EN4; the RFIC 300 is in a transmit mode when EN2 is asserted, and in a receive mode when EN4 is asserted. EN2 and EN4 cannot be asserted at the same time. EN1 is de-asserted only when the RFIC 300 is in a receive mode and configured in a split configuration. EN3 is asserted only when the RFIC 300 is in a transmitter mode and configured in a co-share configuration.

Transmitter 310 operates in accordance with a first power supply domain across a first power supply node $V_{DD1}$ and a first ground node $V_{SS1}$. Transmitter 310 is enabled when EN2 is asserted and disabled otherwise. Transmitter 310 comprises: a power amplifier (PA) 311 configured to receive a to-be-transmitted signal $V_{tx}$ (which is embodied in a differential signaling scheme and comprising two voltages $V_{tx+}$ and $V_{tx-}$) and output a first amplified signal $V_a$ (which is embodied in a differential signaling scheme and comprising two voltages $V_{a+}$ and $V_{a-}$) in accordance with EN2; a first balun transformer T1 configured to transform $V_a$ into a first voltage $V_1$ at N1; a first switch-capacitor network SC1 comprising a serial connection of a first capacitor C1 and a first switch S1 controlled by EN1. When EN2 is asserted, the PA 311 amplifies $V_{tx}$ into $V_a$, which is subsequently transformed into $V_1$ via T1, whose function is two-fold: differential to single-ended conversion, and impedance transformation. Note that a center-tap of a primary coil T1$p$ (of T1) is connected to $V_{DD1}$ to provide a power supply to PA 311.

Receiver 320 operates in accordance with a second power supply domain across a second power supply node $V_{DD2}$ and a second ground node $V_{SS2}$ and is configured to receive a second voltage $V_2$ at N2 and output a received signal $V_{rx}$ (which is embodied in a differential signaling scheme and comprises two voltages $V_{rx+}$ and $V_{rx-}$) in accordance EN2, EN3, and EN4; receiver 320 is enabled when EN4 is asserted, and disabled otherwise. Receiver 320 comprises: a T-coil 322 comprising a first inductor L1 and a second inductor L2; a second switch-capacitor network SC2 comprising a serial connection of a second capacitor C2 and a second switch S2 controlled by EN2; a third switch S3 controlled by EN3; a low-noise amplifier (LNA) 321 controlled by EN4; and a second balun transformer T2. L2 is inserted between N2 and a third node N3 and is configured to provide an impedance-matching gain so that a third voltage $V_3$ at N3 can be larger than $V_2$ at N2 when S3 is de-asserted. L1 is inserted between N1 and N2. In an co-share configuration, L1 is configured to provide an impedance-matching gain so that $V_2$ at N2 can be larger than $V_1$ at N1; in a split configuration, L1 along with an on-board capacitor inserted between "p1" and "p2" externally (i.e., the on-board capacitor 227 of FIG. 2B or the on-board capacitor 237 of FIG. 2C) can form a parallel resonant network to provide isolation between N1 and N2. When EN2 is asserted and EN3 is de-asserted, the LNA 321 amplifies $V_3$ into a second amplified signal $V_b$, which is subsequently transformed into the received signal $V_{rx}$ via T2, whose function is two-fold: single-ended to differential conversion, and impedance transformation. Note that "$V_{DD2}$" provides a power supply to LNA 321 via a primary coil T2$p$ of T2.

First, consider the co-share configuration, wherein "p2" is terminated with a high-impedance component (i.e., $Z_H$ 215 in FIG. 2A).

When RFIC 300 is in a transmit mode in the co-share configuration, EN1 is asserted, EN2 is asserted, EN3 is asserted, and EN4 is de-asserted. In this case, L1 and L2 are effectively connected in series to form a load inductance (looking from N1 into the receiver 320), which along with a secondary coil T1$s$ (of T1) and C1 form a parallel resonant network to boost an output impedance of the transmitter 310 and thus allow $V_1$ at N1 to be large. This way, the loading effect of the receiver 320 is mitigated.

When RFIC 300 is in a receive mode in the (TX-RX) co-share configuration, EN1 is asserted, EN2 is de-asserted, EN3 is de-asserted, and EN4 is asserted. In this case, C1 and T1$s$ form a resonant network to boost an output impedance of the transmitter 310 thus mitigating a loading effect of the transmitter 310 to ensure $V_1$ at N1 is not adversely affected by the transmitter 310; L1 and L2 provide a large impedance-matching gain to make $V_3$ at N3 appreciably larger than $V_1$ at N1; LNA 321 amplifies $V_3$ into a second amplified signal $V_b$; and T2 transforms $V_p$ into $V_{rx}$.

Next, consider the (TX-RX) split configuration, wherein "p2" and "p1" are coupled externally via an on-board capacitor (i.e., the on-board capacitor 227 in FIG. 2B or the on-board capacitor 237 in FIG. 2C) comprising an on-board capacitor.

When RFIC 300 is in a transmit mode in the split configuration, EN1 is asserted, EN2 is asserted, EN3 is de-asserted, and EN4 is de-asserted. In this case, C1 and T1$s$ form a parallel resonant network to boost an output impedance of the transmitter 310 to allow $V_1$ at N1 to be large; L2 and C2 form a serial resonant network so that N2 becomes a low impedance node; and L1 and the on-board capacitor form a parallel resonant network to establish a high impedance to mitigate a loading effect from the receiver 320. This way, an output of the transmitter 310 can be effectively delivered to an external transmission line (i.e., transmission line 225 in FIG. 2B or transmission line 235 in FIG. 2C) via "p1" without being adversely impacted by the receiver 320.

When RFIC 300 is in a receive mode in the split configuration, EN1 is de-asserted, EN2 is de-asserted, EN3 is de-asserted, and EN4 is asserted. In this case, L1 and the on-board capacitor form a parallel resonant work to establish a high impedance to mitigate a loading effect of the transmitter 310. This way, an input can be received from an on-board transmission line (i.e., transmission line 223 in FIG. 2B or transmission line 236 in FIG. 2C) via "p2," effectively resulting in $V_2$ at N2 without being adversely impacted by the transmitter 310; L2 provides an impedance-matching gain so that $V_3$ at N3 is larger than $V_2$ at N2; LNA 321 is enabled and amplifies $V_3$ into $V_b$, which is subsequently transformed into $V_{rx}$ by T2.

Figure 4:
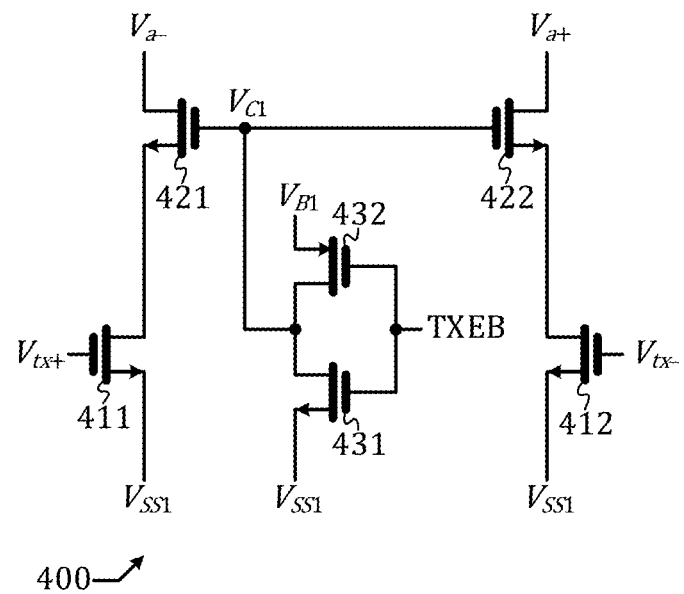
FIG. 4 shows a schematic diagram of a power amplifier.

A schematic diagram of a power amplifier 400 that can embody PA 311 of FIG. 3 is depicted in FIG. 4. Power amplifier 400 comprises: NMOS transistors 411, 412, 421, 422, and 431, and PMOS transistor 432. NMOS transistors 411 and 412 are identical and form a pseudo differential common-source amplifier pair, while NMOS transistors 421 and 422 are identical and form a cascode pair. $V_{C1}$ denotes a gate voltage for NMOS transistors 421 and 422. $V_{B1}$ denotes a bias voltage that is higher than a threshold voltage of NMOS transistors 421 and 422. NMOS transistor 431 and PMOS 432 transistor form an inverter. EN2B denotes a logical inversion of EN2. When EN2 is asserted (i.e. high), EN2B is low due to the logical inversion, and the gate voltage $V_{C1}$ is pulled up to $V_{B1}$ by PMOS transistor 432, thus turning on NMOS transistors 421 and 422 and allow NMOS transistors 411 and 412 to amplify $V_{tx+}$ and $V_{tx-}$ and output $V_{a-}$ and $V_{a+}$ via NMOS transistors 421 and 422, respectively. When EN2 is de-asserted (i.e. low), EN2B is high due to the logical inversion, and the gate voltage $V_{C1}$ is pulled down to ground $V_{SS1}$ by NMOS transistor 431, thus turning off NMOS transistors 421 and 422 and effectively shutting off NMOS transistors 411 and 412. Power amplifier 400 is well known in the prior art and therefore no further description is given here.

Figure 5:
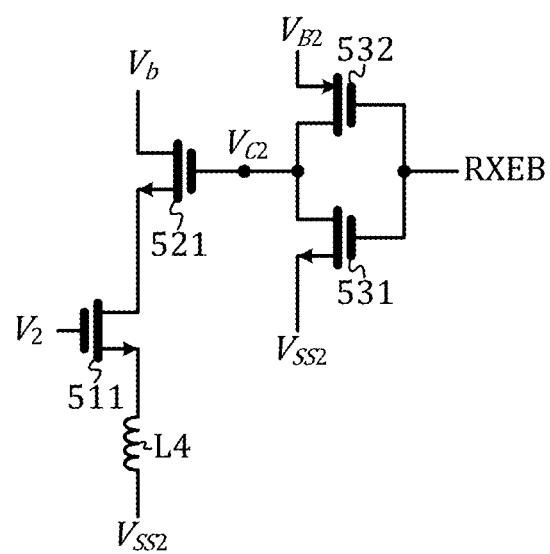
FIG. 5 shows a schematic diagram of a low-noise amplifier.

A schematic diagram of a low-noise amplifier 500 that can embody LNA 321 of FIG. 3 is depicted in FIG. 5. Low-noise amplifier 500 comprises: NMOS transistors 511, 521, and 531, PMOS transistor 532, and an inductor L4. NMOS transistors 511 functions as a common-source amplifier, NMOS transistors 521 functions as a cascode device, while inductor L4 provides a source degeneration for NMOS transistor 511. $V_{C2}$ denotes a gate voltage for NMOS transistor 521. $V_{B2}$ denotes a bias voltage that is higher than a threshold voltage of NMOS transistor 521. NMOS transistor 531 and PMOS transistor 532 form an inverter. EN4B denotes a logical inversion of EN4. When EN4 is asserted (i.e. high), EN4B is low due to the logical inversion, and the gate voltage $V_{C2}$ is pulled up to $V_{B2}$ by PMOS transistor 532, thus turning on NMOS transistors 521 and allowing NMOS transistors 511 to amplify $V_2$ and output $V_b$ via NMOS transistor 521. When EN4 is de-asserted (i.e. low), EN4B is high due to the logical inversion, and the gate voltage $V_{C2}$ is pulled down to ground ($V_{SS2}$) by NMOS transistor 531, thus turning off NMOS transistors 521 and effectively shutting off NMOS transistors 511. Low-noise amplifier 500 is well known in the prior art and therefore no further description is given here.

A frontend module such as FEM 233 integrates a power amplifier, a low-noise amplifier, and a duplexing circuit, which is usually a single pole double throw switch. Frontend modules are readily commercially available from many sources and are well understood by those of ordinary skills in the art and thus not described in detail here.

There are many more circuits integrated into RFIC 300, including circuits that generate the to-be-transmitted signal $V_{tx}$ and circuits that further process the received signal $V_{rx}$. Likewise, there are many additional pins that allow circuits in RFIC 300 to interface with the PCB where RFIC 300 is soldered on. These are obvious to those of ordinary skills in the art and thus not described in detail to avoid obscuring aspects of this present disclosure.

The transmitter 310 and the receiver 320 work in different power domains for a purpose of reducing a coupling via power supply nodes or ground nodes. By way of example but not limitation, $V_{DD1}$ is 3.3V; $V_{DD2}$ is 1.05V; RFIC 300 is packaged in a 88-pin QFN (quad flat no-lead) package; a frequency of the to-be-transmitted signal $V_{tx}$ is the same as a frequency of the received signal $V_{rx}$ and is between 4.9 GHz and 7.2 GHz; L1 is 1 nH; L2 is 3.5 nH; C1 is 300 fF; C2 is 300 fF; the on-board capacitor (i.e. on-board capacitor 227 in FIG. 2B or on-board capacitor 237 in FIG. 2C) is 1 pF.

In an optional embodiment, RFIC 300 further comprises a ESD (electrostatic discharge) circuit 322 coupled to N3 and configured to provide a discharge path in an electrostatic discharge event to protect LNA 321. A concept of ESD is well known in the prior art and those skilled in the art can choose a suitable circuit readily known to embody ESD circuit 322 at their discretion.

T-coil 322 comprises L1 and L2 that are magnetically coupled to each other with a coupling coefficient $k_{12}$. Due to the magnetic coupling, effective inductances of L1 and L2 can be enlarged, allowing a more layout efficient implementation.

Figure 6:
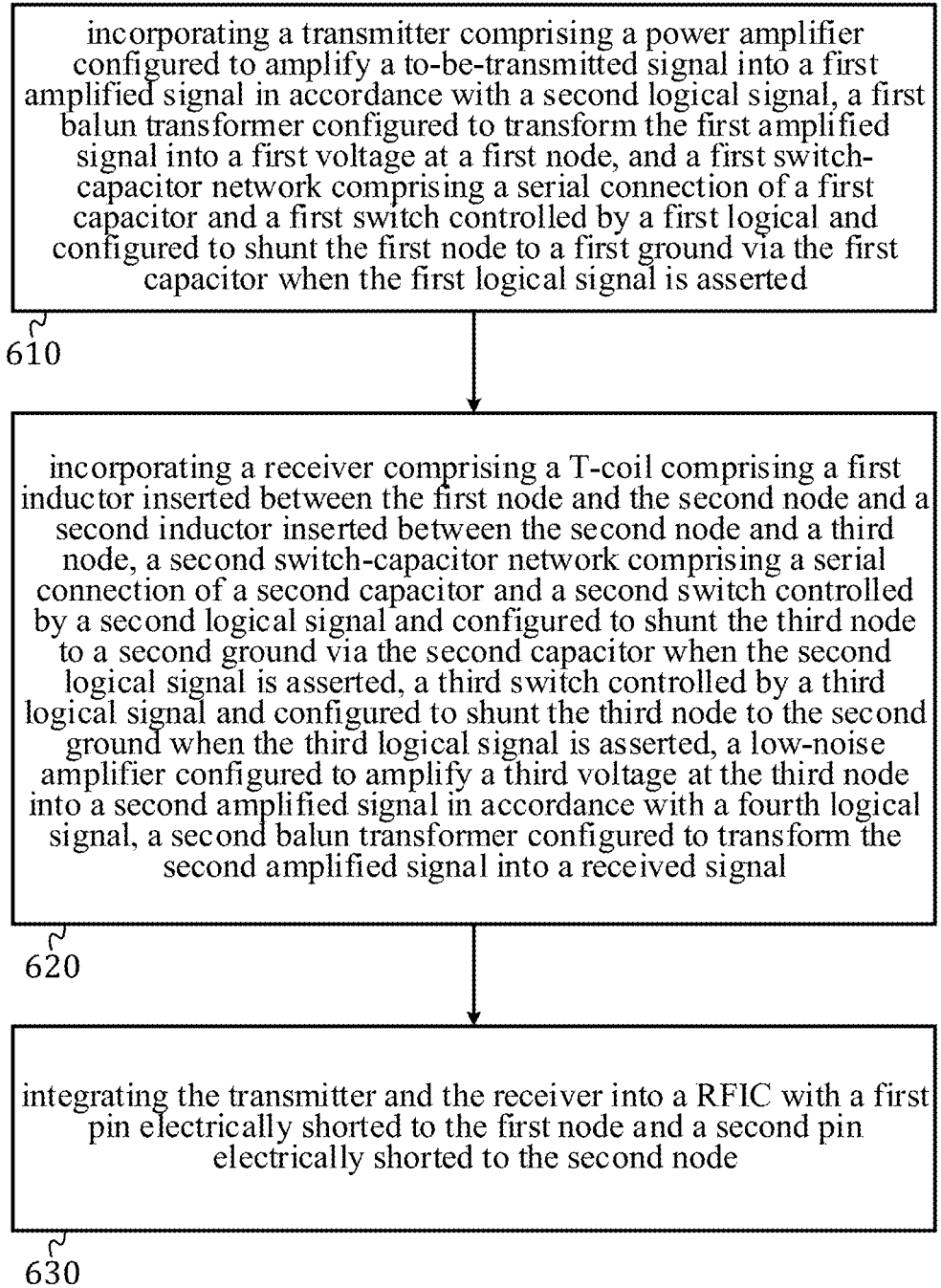
FIG. 6 shows a flow diagram of a method in accordance with the present disclosure.

As illustrated by a flow diagram shown in FIG. 6, a method of integrating a RFIC comprises: (step 610) incorporating a transmitter comprising a power amplifier configured to amplify a to-be-transmitted signal into a first amplified signal in accordance with a second logical signal, a first balun transformer configured to transform the first amplified signal into a first voltage at a first node, and a first switch-capacitor network comprising a serial connection of a first capacitor and a first switch controlled by a first logical and configured to shunt the first node to a first ground via the first capacitor when the first logical signal is asserted; (step 620) incorporating a receiver comprising a T-coil comprising a first inductor inserted between the first node and the second node and a second inductor inserted between the second node and a third node, a second switch-capacitor network comprising a serial connection of a second capacitor and a second switch controlled by a second logical signal and configured to shunt the third node to a second ground via the second capacitor when the second logical signal is asserted, a third switch controlled by a third logical signal and configured to shunt the third node to the second ground when the third logical signal is asserted, a low-noise amplifier configured to amplify a third voltage at the third node into a second amplified signal in accordance with a fourth logical signal, a second balun transformer configured to transform the second amplified signal into a received signal; (step 630) integrating the transmitter and the receiver into a RFIC with a first pin electrically shorted to the first node and a second pin electrically shorted to the second node.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A radio frequency integrated circuits (RFIC) comprising a transmitter, a receiver, a first pin electrically shorted to a first node, and a second pin electrically shorted to a second node, wherein:
    the transmitter comprises a power amplifier configured to amplify a to-be-transmitted signal into a first amplified signal in accordance with a second logical signal, a first balun transformer configured to transform the first amplified signal into a first voltage at the first node, and a first switch-capacitor network comprising a serial connection of a first capacitor and a first switch controlled by a first logical signal and configured to shunt the first node to a first ground via the first capacitor when the first logical signal is asserted; and
    the receiver comprises a T-coil comprising a first inductor inserted between the first node and the second node and a second inductor inserted between the second node and a third node, a second switch-capacitor network comprising a serial connection of a second capacitor and a second switch controlled by a second logical signal and configured to shunt the third node to a second ground via the second capacitor when the second logical signal is asserted, a third switch controlled by a third logical signal and configured to shunt the third node to the second ground when the third logical signal is asserted, a low-noise amplifier configured to amplify a third voltage at the third node into a second amplified signal in accordance with a fourth logical signal, and a second balun transformer configured to transform the second amplified signal into a received signal.

2. The RFIC of claim 1 being in a transmit mode when the second logical signal is asserted and in a receive mode when the fourth logical signal is asserted, and the second logical signal and the fourth logical signal cannot be asserted at the same time.

3. The RFIC of claim 2 being soldered onto a printed circuit board (PCB).

4. The RFIC of claim 3, wherein in a transmitter-receiver (TX-RX) co-share configuration the second pin is terminated with a high-impedance component on the PCB.

5. The RFIC of claim 4, wherein in the transmit mode the first logical signal, the second logical signal, and the third logical signal are asserted, while the fourth logical signal is de-asserted.

6. The RFIC of claim 4, wherein in the receive mode the first logical signal and the fourth logical signal are asserted, while the second logical signal and the third logical signal are de-asserted.

7. The RFIC of claim 3, wherein in a TX-RX split configuration the first pin and the second pin are coupled via an external capacitor on the PCB.

8. The RFIC of claim 7, wherein in a transmit mode the first logical signal and the second logical signal are asserted, while the third logical signal and the fourth logical signal are de-asserted.

9. The RFIC of claim 7, wherein in a receive mode the first logical signal, the second logical signal, and the third logical signal are de-asserted, while the fourth logical signal is asserted.

10. The RFIC of claim 1 further comprising a electrostatic discharge (ESD) circuit coupled to the third node to provide a discharge path in an ESD event.

11. A method of integrating a radio frequency integrated circuits (RFIC) comprising:
    incorporating a transmitter comprising a power amplifier configured to amplify a to-be-transmitted signal into a first amplified signal in accordance with a second logical signal, a first balun transformer configured to transform the first amplified signal into a first voltage at a first node, and a first switch-capacitor network comprising a serial connection of a first capacitor and a first switch controlled by a first logical signal and configured to shunt the first node to a first ground via the first capacitor when the first logical signal is asserted;
    incorporating a receiver comprising a T-coil comprising a first inductor inserted between the first node and a second node and a second inductor inserted between the second node and a third node, a second switch-capacitor network comprising a serial connection of a second capacitor and a second switch controlled by a second logical signal and configured to shunt the third node to a second ground via the second capacitor when the second logical signal is asserted, a third switch controlled by a third logical signal and configured to shunt the third node to the second ground when the third logical signal is asserted, a low-noise amplifier configured to amplify a third voltage at the third node into a second amplified signal in accordance with a fourth logical signal, a second balun transformer configured to transform the second amplified signal into a received signal; and integrating the transmitter and the receiver into the RFIC with a first pin electrically shorted to the first node and a second pin electrically shorted to the second node.

12. The method of integrating a RFIC of claim 11, wherein the RFIC is in a transmit mode when the second logical signal is asserted and is in a receive mode when the fourth logical signal is asserted, and the second logical signal and the fourth logical signal cannot be asserted at the same time.

13. The method of integrating a RFIC of claim 12 further comprising soldering the RFIC on a printed circuit board (PCB).

14. The method of integrating a RFIC of claim 13 further comprising terminating the second pin with an external high-impedance component on the PCB when the RFIC is used in a transmitter-receiver (TX-RX) co-share configuration.

15. The method of integrating a RFIC of claim 14, wherein in the transmit mode the first logical signal, the second logical signal, and the third logical signal are asserted, while the fourth logical signal is de-asserted.

16. The RFIC of claim 14, wherein in the receive mode the first logical signal and the fourth logical signal are asserted, while the second logical signal and the third logical signal are de-asserted.

17. The method of integrating a RFIC of claim 13 further comprising using an external capacitor on the PCB to couple the first pin to the second pin when the RFIC is used in a TX-RX split configuration.

18. The method of integrating a RFIC of claim 17, wherein in a transmit mode the first logical signal and the second logical signal are asserted, while the third logical signal and the fourth logical signal are de-asserted.

19. The method of integrating a RFIC of claim 17, wherein in a receive mode the first logical signal, the second logical signal, and the third logical signal are de-asserted, while the fourth logical signal is asserted.

20. The method of integrating a RFIC of claim 17 further comprising incorporating a electrostatic discharge (ESD) circuit coupled to the third node to provide a discharge path in an ESD event.

* * * * *